(12) United States Patent
Rosenau

(10) Patent No.: US 7,018,219 B2
(45) Date of Patent: Mar. 28, 2006

(54) INTERCONNECT STRUCTURE AND METHOD FOR CONNECTING BURIED SIGNAL LINES TO ELECTRICAL DEVICES

(76) Inventor: Steven A. Rosenau, 305 Cypress Point Dr., Mountain View, CA (US) 94043

( * ) Notice: Subject to any disclaimer, the term of this patent is extended or adjusted under 35 U.S.C. 154(b) by 0 days.

(21) Appl. No.: 10/787,647

(22) Filed: Feb. 25, 2004

(65) Prior Publication Data

US 2005/0176272 A1    Aug. 11, 2005

(51) Int. Cl.
*H01R 12/00*    (2006.01)
(52) U.S. Cl. .................. 439/78; 361/760; 174/260
(58) Field of Classification Search ............... 439/78, 439/65, 68, 760; 361/772, 760; 29/830; 174/260

See application file for complete search history.

(56) References Cited

U.S. PATENT DOCUMENTS

| | | | | |
|---|---|---|---|---|
| 3,875,479 | A | * | 4/1975 | Jaggar ..................... 361/792 |
| 5,241,456 | A | * | 8/1993 | Marcinkiewicz et al. ... 361/792 |
| 5,489,749 | A | * | 2/1996 | DiStefano et al. .......... 174/261 |
| 5,516,303 | A | * | 5/1996 | Yohn et al. ................. 439/248 |
| 6,340,606 | B1 | * | 1/2002 | Hashimoto ................. 438/106 |
| 6,366,467 | B1 | * | 4/2002 | Patel et al. ................. 361/760 |
| 6,459,592 | B1 | * | 10/2002 | Anzai ......................... 361/760 |
| 6,593,535 | B1 | * | 7/2003 | Gailus ........................ 174/262 |
| 2001/0018987 | A1 | * | 9/2001 | Tzanavaras et al. ........ 174/260 |
| 2003/0133274 | A1 | * | 7/2003 | Chen et al. ................. 361/760 |

* cited by examiner

*Primary Examiner*—Michael C. Zarroli

(57) ABSTRACT

An electrical component, such as a trace, signal line, or contact pad connected to the trace or signal line, is covered by one or more layers. The electrical component is connected directly to an electrical device by forming an opening through the one or more layers. The opening exposes a portion of the electrical component. A connector, such as a solder ball, a pin contact, or a wire bond, is then attached to the exposed portion of the electrical component. The connector connects directly to another electrical device to create an electrical connection between the electrical component and the electrical device. The electrical device may be configured, for example, as a second signal line or contact pad in another stripline circuit, a microstrip circuit, an integrated circuit, or an electrical component.

16 Claims, 5 Drawing Sheets

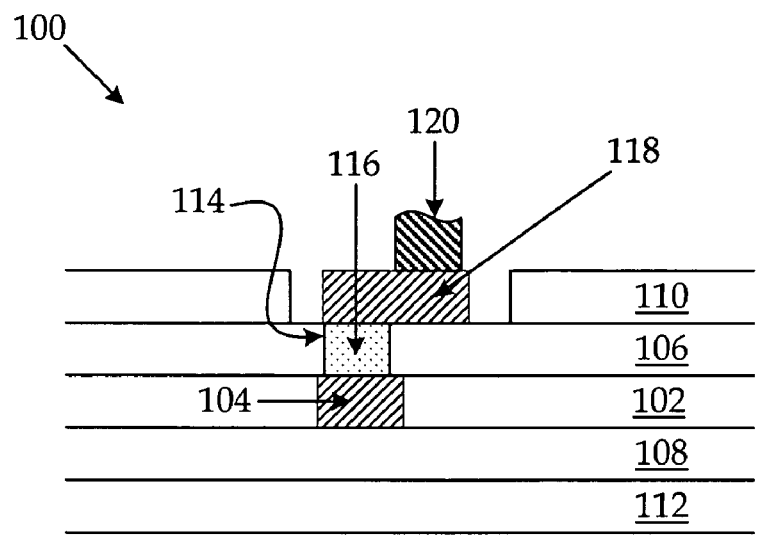
FIG. 1 - Prior Art
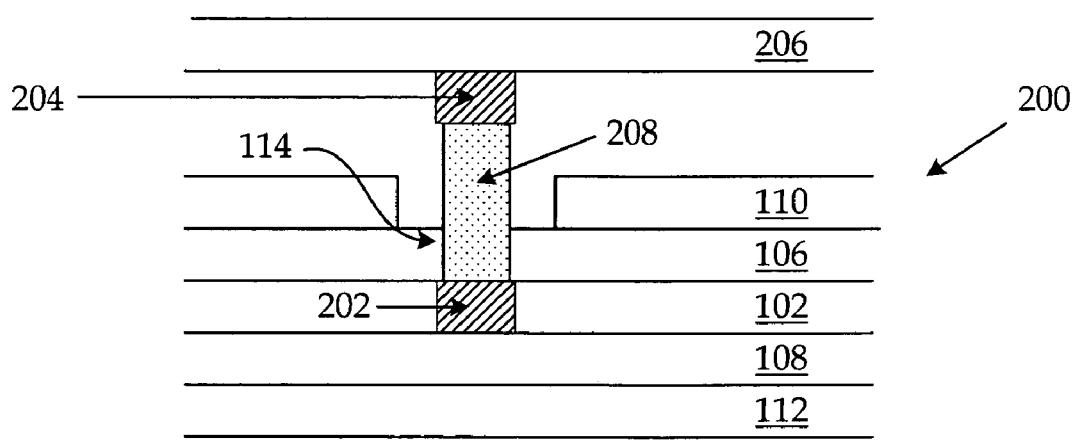
FIG. 2

INTERCONNECT STRUCTURE AND METHOD FOR CONNECTING BURIED SIGNAL LINES TO ELECTRICAL DEVICES

BACKGROUND

In many electrical components, such as printed circuit boards, a trace or signal line is covered by one or more layers of material. For example, a signal line may be covered by a dielectric layer and a ground layer. An opening, or via, must then be created through the ground and dielectric layers in order to make electrical contact with the exposed portion of the signal line.

FIG. 1 is a cross-sectional diagram of a portion of a stripline circuit according to the prior art. The stripline circuit 100 includes a signal layer 102 with a via capture pad 104 surrounded by two dielectric layers 106, 108. Ground layers 110, 112 cover dielectric layers 106, 108, respectively. Via capture pad 104 is in contact with a trace or signal line (not shown) in signal layer 102.

A via 114 has been created through ground layer 110 and dielectric layer 106 to expose a portion of via capture pad 104. A metal 116 fills via 114 in order to create an electrical connection between via capture pad 104 and contact pad 118. Another signal line or electrical device (not shown) may be connected to contact pad 118 using a metal connector 120. Connector 120 may be configured, for example, as a solder ball, a contact pin, or a wire bond.

Via capture pad 104, metal 116, contact pad 118, and connector 120 form an interconnect between the signal line connected to via capture pad 104 and another electrical device. Unfortunately, parasitic inductance and capacitance are increased by the structure of the interconnect. Contact pad 118 adds additional parasitic capacitance while via 114 and metal 116 increase the parasitic inductance in the connection. Vias can also limit the density of a circuit when the minimum dimensions for a via capture pad 104 are larger than the minimum dimensions needed for an interconnect.

SUMMARY

In accordance with the invention, an interconnect structure and method for connecting buried signal lines to electrical devices are provided. An electrical component, such as a trace, a signal line, or a contact pad connected to the trace or signal line, is covered by one or more layers. The electrical component is connected directly to an electrical device by forming an opening through the one or more layers. The opening exposes a portion of the electrical component. A connector, such as a solder ball, a pin contact, or a wire bond, is then attached to the exposed portion of the electrical component. The connector connects directly to another electrical device to create an electrical connection between the electrical component and the electrical device. The electrical device may be configured, for example, as a second signal line or contact pad in another stripline circuit, a microstrip circuit, an integrated circuit, or an electrical component.

BRIEF DESCRIPTION OF THE DRAWINGS

The invention will best be understood by reference to the following detailed description of embodiments in accordance with the invention when read in conjunction with the accompanying drawings, wherein:

FIG. 1 is a cross-sectional diagram of a portion of a stripline circuit according to the prior art;

FIG. 2 is a cross-sectional diagram of a section of a stripline circuit connected to an electronic device in a first embodiment in accordance with the invention;

DETAILED DESCRIPTION

Figure 3:
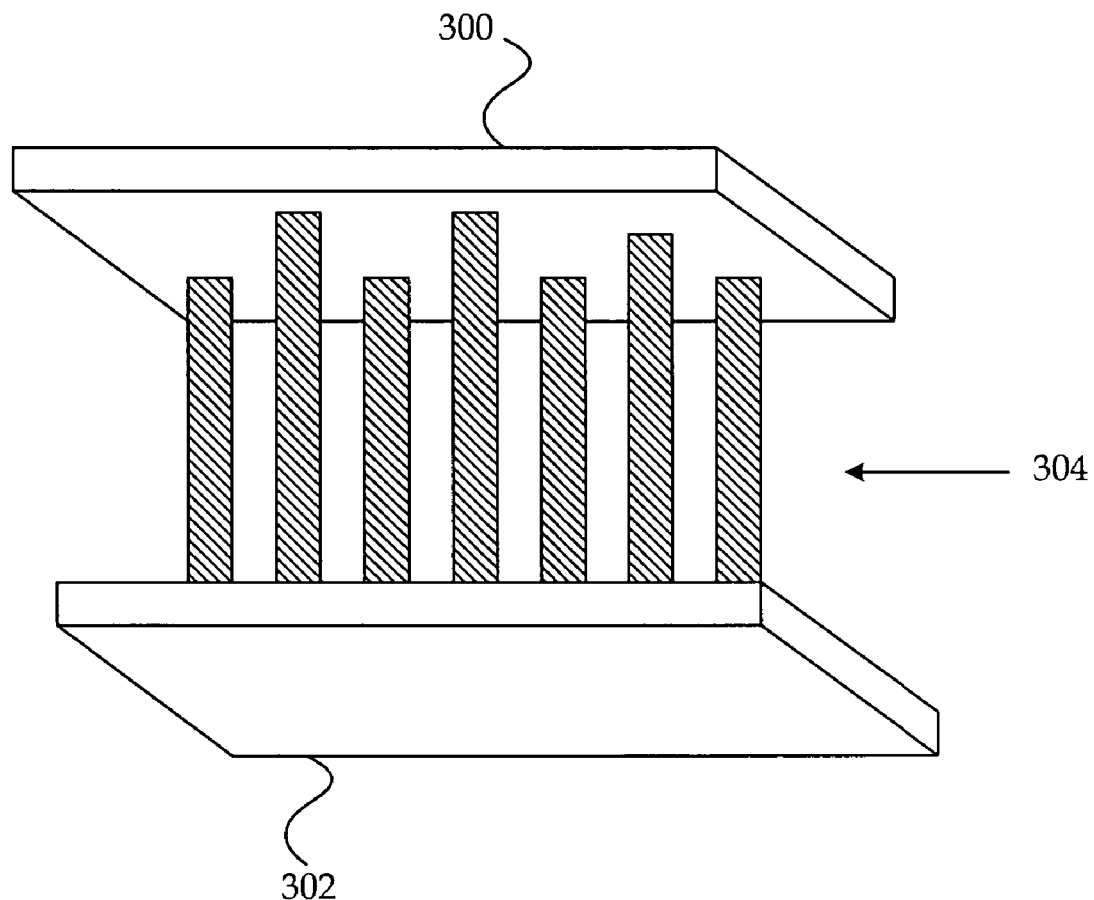
FIG. 3 is an enlarged perspective view of a portion of a pin grid array in an embodiment in accordance with the invention.

The following description is presented to enable one skilled in the art to make and use the invention, and is provided in the context of a patent application and its requirements. Various modifications to the disclosed embodiments will be readily apparent to those skilled in the art, and the generic principles herein may be applied to other embodiments. Thus, the invention is not intended to be limited to the embodiments shown, but is to be accorded the widest scope consistent with the appended claims and with the principles and features described herein. It should be understood that the drawings referred to in this description are not drawn to scale.

With reference now to the figures and in particular with reference to FIG. 2, there is shown a cross-sectional diagram of a section of a stripline circuit connected to an electronic device in a first embodiment in accordance with the invention. Stripline circuit 200 includes a signal layer 102 with a contact pad 202 surrounded by two dielectric layers 106, 108. Ground layers 110, 112 cover dielectric layers 106, 108, respectively. Contact pad 202 may be formed to any desired dimension and is in contact with a trace or signal line (not shown) in signal layer 102 in this embodiment in accordance with the invention. In other embodiments in accordance with the invention, contact pad 202 is the trace or signal line itself, an electrical component, or an integrated circuit.

An opening 114 has been created through ground layer 110 and dielectric layer 106 to expose a portion of the contact pad 202. In this embodiment in accordance with the invention, an electrical connection between contact pad 204 in electrical device 206 and contact pad 202 in stripline circuit 200 is made directly by connector 208. Electrical device 206 may be implemented, for example, as another stripline circuit, a microstrip circuit, an integrated circuit, or an electrical component. And connector 208 includes, but is not limited to, a solder ball, a contact pin, a wire bond, or other contact method.

Contact pad 202, connector 208, and contact pad 204 form an interconnect in this embodiment and create an electrical connection between electrical device 206 and a signal line connected to contact pad 202. As shown in FIG. 2, the thickness of dielectric layer 106 and ground layer 110 are less than the height of connector 208 so that connector 208 can connect with contact pad 204. In other embodiments in accordance with the invention, a stripline circuit may include more layers than the ones shown in FIG. 2. In these other embodiments, the total thickness of the layers overlying a contact pad should be less than the height or thickness of the connector.

FIG. 3 is an enlarged perspective view of a portion of a pin grid array in an embodiment in accordance with the invention. Stripline circuits 300, 302 are connected electrically together by pin grid array 304. Pin grid array 304 includes a number of metal pins that utilize the interconnect structure of FIG. 2. Thus, the pins in pin grid array 304 are inserted directly into the openings to form direct electrical connections between various signal lines located throughout the two circuits 300, 302. Those skilled in the art will appreciate that in other embodiments in accordance with the invention a ball grid array may be substituted for the pin grid array 304.

Referring now to FIGS. 4A–4D, there are shown cross-sectional diagrams of a section of a stripline circuit that illustrate a method for fabricating an interconnect in a first embodiment in accordance with the invention. Stripline circuit 400 includes a signal layer 102 with a contact pad 202 surrounded by two dielectric layers 106, 108. Ground layers 110, 112 cover dielectric layers 106, 108, respectively. Contact pad 202 is in contact with a trace or signal line (not shown) in signal layer 102 in this embodiment in accordance with the invention. In other embodiments in accordance with the invention, contact pad 202 is the trace or signal line itself, an electrical component, or an integrated circuit.

Figure 4A:
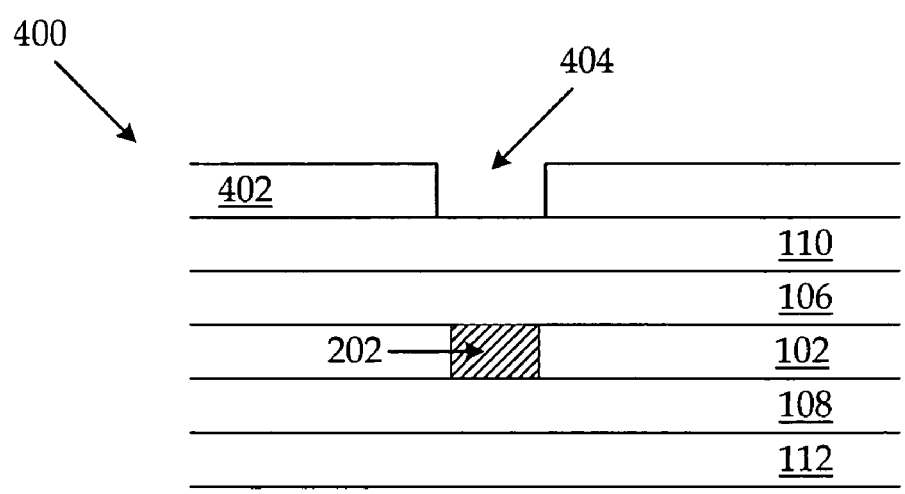
FIGS. 4A–4D are cross-sectional diagrams of a section of a stripline circuit that illustrate a method for fabricating an interconnect in a first embodiment in accordance with the invention.

A mask or photoresist layer 402 is formed or deposited over ground layer 110, as shown in FIG. 4A. The mask is developed and patterned using conventional patterning techniques to create a gap 404 where an opening to contact pad 202 will be created. The ground layer 110 not covered by the photoresist layer 402 is then etched to expose a portion of the dielectric layer 106. The etch process may be performed, for example, by a chemical etch. The photoresist layer 402 is then removed.

Figure 4B:
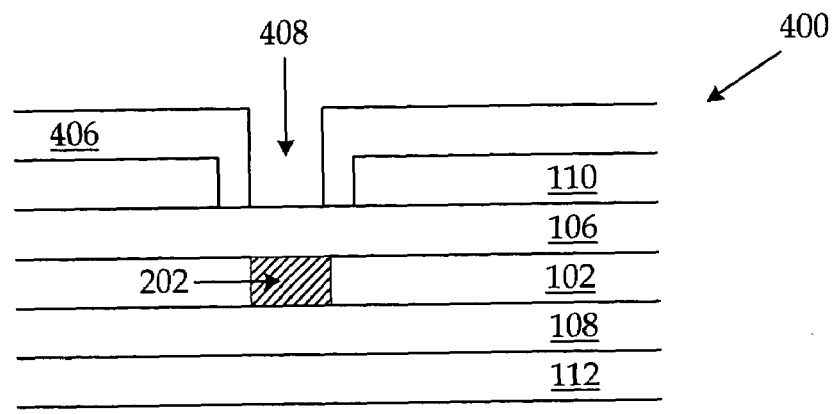

FIG. 4B illustrates the stripline circuit 400 with another mask or photoresist layer 406 deposited over the dielectric layer 106. The photoresist layer 406 is developed and patterned using conventional patterning techniques to create a gap 408 where the opening will be created. The dielectric layer 106 not covered by the mask 406 is then etched to expose a portion of contact pad 202. The photoresist layer 406 is then removed.

Contact pad 202 may act as an etch stop in this embodiment in accordance with the invention. Those skilled in the art will appreciate that the opening may be formed using techniques other than etching. For example, the opening may be created with a mechanical or laser drilling technique.

Figure 4C:
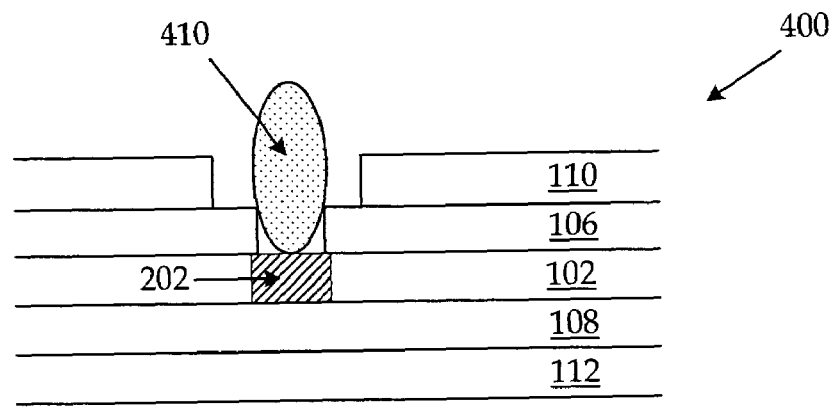
Figure 4D:
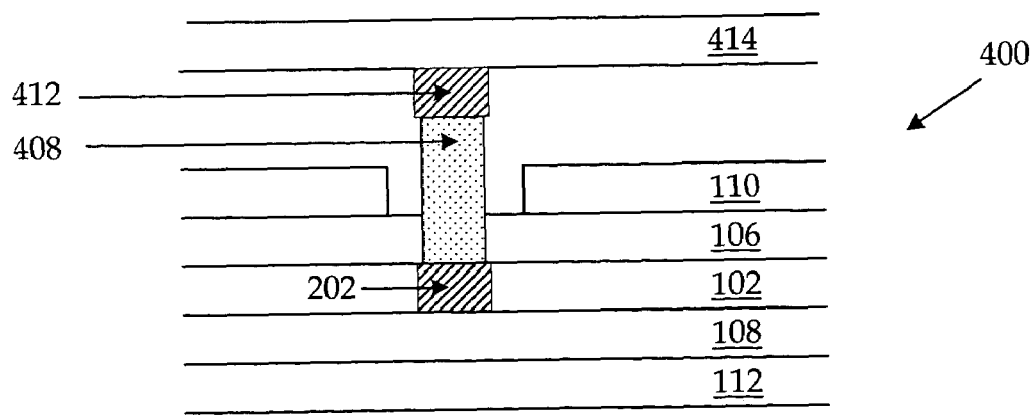

A solder ball 410 is used in FIG. 4C to form an electrical connection in this embodiment in accordance with the invention. Those skilled in the art will appreciate the electrical connection may be implemented using other conductive connection techniques, including, but not limited to, a contact pin, a flip-chip bump, a wire bond, a pin grid array, a ball grid array, and surface-mount techniques. Solder ball 410 is deposited into the opening to make contact with contact pad 202. When melted, the solder bonds contact pad 202 in signal layer 102 directly to a contact pad 412 in electrical device 414. This step is shown in FIG. 4D.

Figure 5:
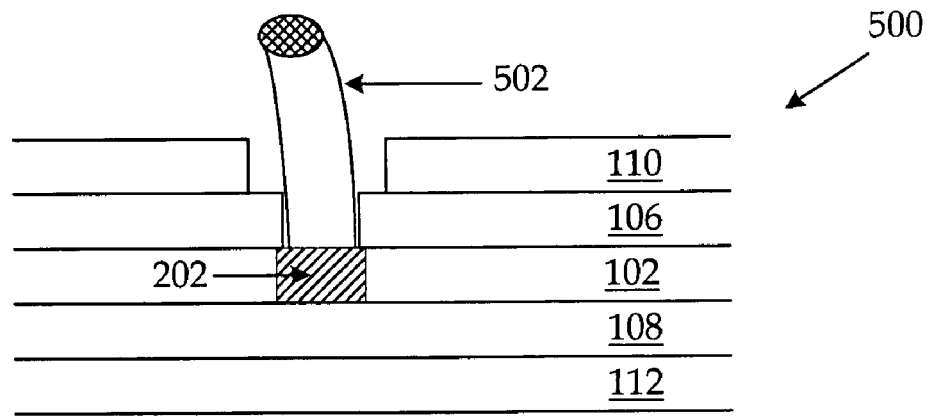
FIG. 5 is a cross-sectional diagram of a portion of a stripline circuit in a second embodiment in accordance with the invention.

Referring now to FIG. 5, there is shown a cross-sectional diagram of a portion of a stripline circuit in a second embodiment in accordance with the invention. Stripline circuit 500 was constructed according to the fabrication techniques described in conjunction with FIGS. 4A–4D. However, in the FIG. 5 embodiment, a wire 502 is bonded to contact pad 202 to create an electrical connection between the contact pad 202 and an electrical device (not shown).

Figure 6A:
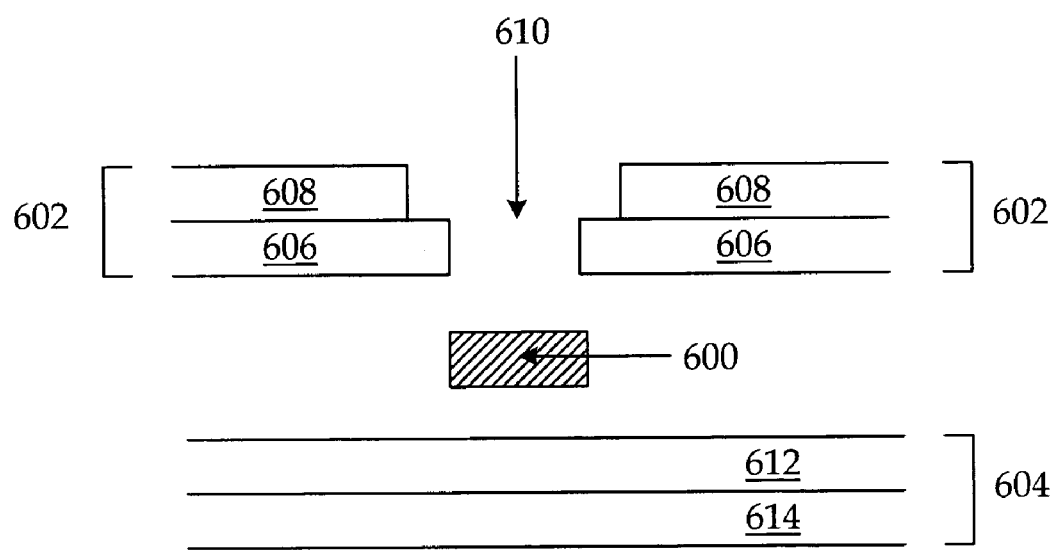
FIGS. 6A–6C are cross-sectional diagrams of a section of a stripline circuit that depict a method for fabricating a stripline circuit in a second embodiment in accordance with the invention.
Figure 6B:
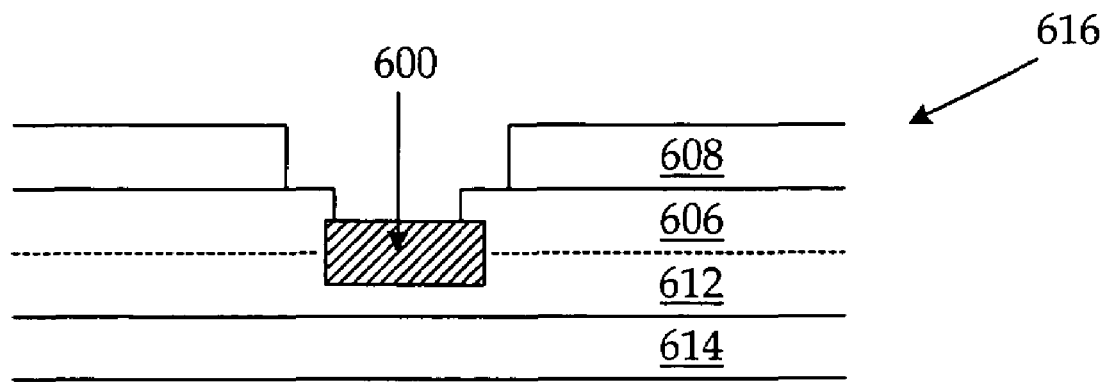
Figure 6C:
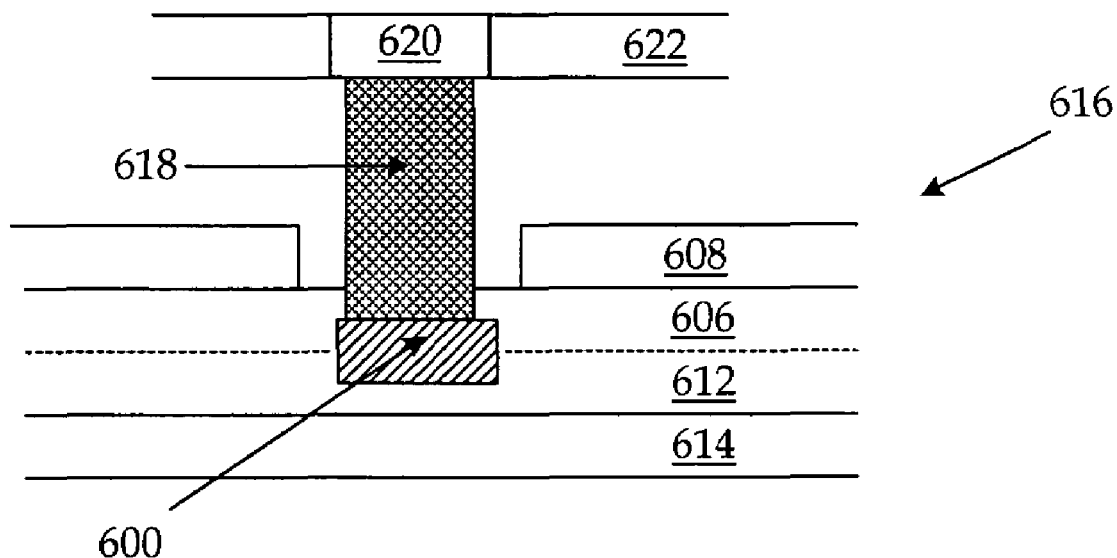

FIGS. 6A–6C are cross-sectional diagrams of a section of a stripline circuit that depict a method for fabricating a stripline circuit in a second embodiment in accordance with the invention. A stripline circuit will be formed with a contact pad 600 and two layers 602, 604, as shown in FIG. 6A. Contact pad 600 is connected to a trace or signal line (not shown) in this embodiment in accordance with the invention. In other embodiments in accordance with the invention, contact pad 202 is the trace or signal line itself, an electrical component, or an integrated circuit.

Layer 602 includes a prefabricated dielectric layer 606 and a prefabricated ground layer 608. Prefabricated dielectric and ground layers 606, 608 have been formed to provide an opening 610 to contact pad 600 when fabrication of the stripline circuit is complete. And layer 604 includes a prefabricated dielectric layer 612 and a prefabricated ground layer 614. To construct the stripline circuit, layer 602 is attached to layer 604 with contact pad 600 in between the layers 602, 604. Methods for attaching layer 602 to layer 604 include, but are not limited to, laminate, fuse, epoxy, or glue.

In one embodiment in accordance with the invention, a signal layer is attached to dielectric layer 612 prior to being patterned to form contact pad 600. The signal layer is then patterned using conventional patterning techniques. In another embodiment in accordance with the invention, the signal layer is patterned separately to form contact pad 600 and the patterned signal layer placed between dielectric layers 606, 612.

Furthermore, ground layers 608 and 614 are attached to dielectric layers 606, 612 prior to attaching dielectric layer 606 to dielectric layer 612 in one embodiment in accordance with the invention. In another embodiment in accordance with the invention, ground layers 608 and 614 are attached to dielectric layers 606, 612 after dielectric layer 606 is attached to dielectric layer 612.

FIG. 6B depicts the stripline circuit 616 after layers 602 and 604 have been combined. Contact pad 600 is now surrounded by dielectric material and opening 610 exposes a portion of contact pad 600. FIG. 6C illustrates a metal pin 618 held by a structure 620 in electrical device 622. The metal pin 618 is bonded to contact pad 600 and forms an electrical connection between electrical device 622 and contact pad 600.

Although the embodiments of FIGS. 2–6 have been described with reference to a stripline circuit, other embodiments in accordance with the invention are not limited to this implementation. An interconnect in accordance with the invention may be utilized whenever a connection to a buried trace or signal line is required, such as, for example, in printed circuit boards and with flip-chipping.

What is claimed is:

1. An interconnect for connecting an electrical component covered by two or more layers in a first stripline circuit to an electrical device, wherein the two or more layers comprise a dielectric layer covered by a ground layer, the interconnect comprising:

an opening through the two or more layers to expose a portion of the electrical component; and a connector in direct contact with the electrical device and extending into the opening to contact the electrical component to form an electrical connection between the electrical component and the electrical device, wherein the connector comprises one of a solder ball, a solder ball in a ball grid array, a wire bond, and a surface mounting.

2. The interconnect of claim 1, wherein the electrical component comprises one of a signal line and a contact pad connected to a signal line.

3. The interconnect of claim 1, wherein the electrical device comprises one of a second stripline circuit, a microstrip circuit, an integrated circuit, and an electrical component.

4. An interconnect, comprising;
a contact pad connected to a signal line in a first stripline circuit, wherein the contact pad and the signal line are covered by two or more layers comprising a dielectric layer covered by a ground layer;
an opening through the two or more layers to expose a portion of the contact pad; and
a connector in direct contact with a second electrical device and extending into the opening to contact the contact pad to form an electrical connection between the contact pad and the second electrical device, wherein the connector comprises one of a solder ball, a solder ball in a ball grid array, a wire bond, a flip-chip bump, and a surface mounting.

5. The interconnect of claim 4, wherein the second electrical device comprises one of a second stripline circuit, a microstrip circuit, an integrated circuit, and an electrical component.

6. A stripline circuit, comprising:
a signal layer including a signal line;
a dielectric layer covering the signal layer;
a ground layer covering the dielectric layer;
an opening through the ground and dielectric layers to expose a portion of the signal line; and
a connector in direct contact wit an electrical device and extending into the opening to contact the exposed portion of the signal line to form an electrical connection between the signal line and the electrical device, wherein the connector comprises one of a solder ball, a solder ball in a ball grid array, a wire bond, and a surface mounting.

7. The stripline circuit of claim 6, wherein the electrical device comprises one of a second stripline circuit, a microstrip circuit, an integrated circuit, and an electrical component.

8. A method for fabricating an interconnect between an electrical component in a first stripline circuit and an electrical device, wherein the electrical component is covered by two or more layers comprising a dielectric layer covered by a ground layer, the method comprising:
forming an opening in the two or more layers to expose a portion of the electrical component; and
introducing a connector into the opening such that the connector makes direct contact with the electrical device and with the electrical component thereby forming an electrical connection between the electrical component and the electrical device, wherein the connector comprises one of a solder ball, a solder ball in a ball grid array, a wire bond, and a surface mounting.

9. The method of claim 8, wherein the electrical component comprises one of a signal line and a contact pad connected to a signal line.

10. The method of claim 8, wherein the electrical device comprises one of a second stripline circuit, a microstrip circuit, an integrated circuit, and an electrical component.

11. A method for fabricating an interconnect in a stripline circuit, comprising:
forming a first dielectric layer, wherein the first dielectric layer is prefabricated with an opening;
forming a second dielectric layer;
attaching the first dielectric layer to the second dielectric layer such that the opening exposes a portion of an electrical component located between the first and second dielectric layers; and
introducing a connector into the opening such that the connector makes direct contact with an electrical device and with the electrical component, thereby forming an electrical connection between the electrical component and the electrical device.

12. The method of claim 11, wherein the electrical component comprises one of a signal line and a contact pad connected to a signal line.

13. The method of claim 11, wherein attaching the first dielectric layer to the second dielectric layer comprises fusing the first and second dielectric layers together.

14. The method of claim 11, wherein attaching the first dielectric layer to the second dielectric layer comprises attaching the first and second dielectric layers together with one of an epoxy, a laminate, and a glue.

15. The method of claim 11, wherein the connector comprises one of a solder ball, a pin, a pin in a pin grid array, a solder ball in a ball grid array, a wire bond, and a surface mounting.

16. The method of claim 11, wherein the electrical device comprises one of a second stripline circuit, a microstrip circuit, an integrated circuit, and an electrical component.

* * * * *